United States Patent [19]

Savia

[11] 3,969,115

[45] July 13, 1976

[54] GRAPHICS PROCESS USING A COMPOSITE OF COLOR SEPARATED NEGATIVES

[75] Inventor: Salvatore P. Savia, West Islip, N.Y.

[73] Assignee: RCS Color Labs, New York, N.Y.

[22] Filed: Oct. 15, 1974

[21] Appl. No.: 514,943

[52] U.S. Cl. .................................. 96/14; 96/17; 96/41
[51] Int. Cl.² ..................... G03C 7/16; G03C 5/04
[58] Field of Search ............... 96/14, 17, 23, 30, 31, 96/32, 41, 42, 1.2

[56] References Cited

UNITED STATES PATENTS

| | | | |
|---|---|---|---|
| 827,241 | 7/1906 | Hyde | 96/30 |
| 2,007,316 | 7/1935 | Van Straaten | 96/5 |
| 2,484,137 | 10/1949 | Wheldon | 96/30 |
| 2,701,196 | 2/1955 | Conrad | 96/6 X |
| 3,144,333 | 8/1964 | Waldherr | 96/17 X |
| 3,156,561 | 10/1964 | Dreyfuss | 96/20 |
| 3,291,603 | 12/1966 | Bryan | 96/20 |
| 3,481,736 | 12/1969 | Ruff | 96/28 |
| 3,676,122 | 7/1972 | Hellmig | 96/23 |
| 3,764,318 | 10/1973 | Laridon | 96/2 |
| 3,796,575 | 3/1974 | Kirsch | 96/14 |

OTHER PUBLICATIONS

The Lithographers Manual, vol. 1, 1958, pp. 6:1–6:16.

*Primary Examiner*—David Klein
*Assistant Examiner*—L. V. Falasco
*Attorney, Agent, or Firm*—Ostrolenk, Faber, Gerb & Soffen

[57] ABSTRACT

A method of making a photographic print having improved sharpness, clarity, texture and highlight definition, suitable for use in dye-transfer printing, engraving, lithography, offset, and the like, involves the production of a primary color separated negative of the image to be printed on a panchromatic film, producing a separated color positive from the separated color negative, producing a reversal positive from the separated color positive on direct reversal film so as to produce a panchromatic primary color separated reversal positive, producing a composite separation negative from the separated color positive and the reversal positive, and producing the desired photographic positive from the composite negative.

8 Claims, No Drawings

GRAPHICS PROCESS USING A COMPOSITE OF COLOR SEPARATED NEGATIVES

BACKGROUND OF THE INVENTION

The reproduction of color photographs or images in books, magazines and the like, whether by a dye-transfer process or photolithography or the like, is basically accomplished by the application to the printed surface of primary color inks or dyes. The amount of each component in the mixture can be controlled, for example, by rheostats in the circuit of each of three projection lanterns. A wide gamut of colors can be matched by appropriate control of the ink or dye and control is obtained by varying the density with which each ink is printed or the concentration of each dye.

Commercial dye-transfer processes involve the making of panchromatic primary color separation negatives from a transparency and thereafter making a positive matrix from the primary color separation negatives which is used to control the application of the printing ink or dye on the surface being printed.

The sharpness, clarity, texture and definition of the final printed color image is a function of the same properties of the color matrix. In turn, the sharpness, clarity, texture and definition of the color matrix is a function of the care exercised in making the primary color negative and color matrix. The care exercised by those engaged in the day-to-day production is quite good and as a result, the final printed color image is quite acceptable.

A method has now been discovered for preparing secondary color prints in which the sharpness, clarity, texture, tone, definition and highlight definition is improved dramatically.

Accordingly, it is the object of this invention to provide a method for making a photographic print of improved sharpness, clarity, texture and definition which is suitable for use in dye-transfer printing, photolithographic printing, engraving, offset printing and duplication of transparencies of colored images. This and other objects of the invention will become apparent to those skilled in the art from the following detailed description.

SUMMARY OF THE INVENTION

This invention relates to a novel method of making a photographic print and more particularly relates to a method of making a photographic print of improved sharpness, clarity, texture and highlight definition, suitable for use in dye-transfer, photolithographic and offset printing, and engraving and involves production of primary color separated negatives on panchromatic film of the image to be printed, producing separated color positives from the separated color negatives, producing reversal positives from the separated color positives on direct reversal film so as to produce panchromatic secondary color separated reversal positives, producing composite color separated negatives from the separated color positives and the reversal positives, and producing a second stage color separated positive for use in the final printing process.

DESCRIPTION OF THE PREFERRED EMBODMENTS

In accordance with the method of the instant invention, primary color separated negatives on panchromatic film are made of the image desired to be printed. Thereafter, separated color positives are prepared from the separated color negatives and reversal positives are prepared from the resulting separated color positives on direct reversal film to obtain panchromatic secondary color separated reversal positives. Each set of two positives, i.e., separated color positive and the reversal positive, are then used to produce a composite color separated negative and the resulting separated negatives are used to make second stage positives which exhibit improved sharpness, clarity, texture, definition, and highlight detail.

It will be appreciated by those skilled in the art that the inventive method is used to produce each of the usual three primary color separated prints. In other words, each of the three primary color separated prints are made by the inventive method either concurrently or sequentially, as desired. Color printing is then effected from the three final separated color prints by standard techniques. For convenience, the method will be described with reference to only one of the prints.

In the first step of the preferred embodiment of this invention, a primary color separated negative of the image to be printed is made on a panchromatic film. The colored image desired to be printed is usually in the form of a print or a transparency. The manipulative steps employed to produce a primary color separated negative from such an image is well known in the art. Accordingly, these manipulative steps will not be described in any detail here beyond noting that three color separated negatives corresponding to the primary colors, red, green and blue, are usually prepared. This is accomplished by the use of appropriate color filters.

In the next step of the process, a separated color positive is produced from the separated color negative. The manipulative steps involved here are also well known in the art and will not therefore be repeated. In commercial dye-transfer, photolithography, engraving and gravure processes, this print is now used to control the application of the dyes or inks to the substrate being printed. In this process of this invention, several other steps are carried out before the print is ready to be used in the color printing process.

In the next step of the preferred process of this invention, the separated color positive is used to produce a reversal positive on direct reversal film. Normally, the transfer of a photographic image involves going from a negative to a positive or a positive to a negative. Reversal means that the same state is transferred, i.e., positive is transferred to positive or negative is transferred to negative. Various procedures exist in the art for producing a reversal image. Some such processes involve an initial development, followed by a washing away of part of the film and a redevelopment of the film. Direct reversal film is designed such that a multiplicity of steps is avoided or if carried out, is done completely by automated equipment. In other words, in direct reversal, only a single development is involved which can be carried out by a technician or by available commercial apparatus. Direct reversal film is available commercially and as one example, duPont's Cronar CRW can be mentioned. Since the primary color separated negative and the separated color positive were prepared on panchromatic film, the direct reversal positive is also a panchromatic secondary color separated reversal positive.

In the next step of the method of the invention, the two positives produced, i.e., the separated color positive and the panchromatic primary color separated reversal positive, are used to make a new primary color separated negative. This can be accomplished, for example, by placing the two positives in a dual projecting lantern and aligning the images projected from both positives so that they are in registry. The result of this step is to produce a color separated negative which is a composite of the two positives. Finally, the composite negative is used to produce a primary color separated print suitable for use in dye-transfer or photolithographic printing and the like.

It will be recognized by those skilled in the art that the method of this invention requires that the original colored image be transferred five separate times, viz to the primary color separated negative, to the separated color positive, to the reversal positive, to the composite negative, and finally to the second stage positive. Usually, employing numerous processing steps in the production of a final print is subject to numerous disadvantages, one of which is that with each processing transfer, the image loses its sharpness, clarity, texture and definition. For this reason, the preparation of photographic prints for use in dye-transfer printing and the like utilize the least amount of processing steps possible. Surprisingly, it has been found that when the foregoing method is employed, using numerous processing steps, the final printed image exhibits a sharpness, clarity, texture and definition which is vastly superior to the conventional two-step process of making a color separated negative and a final photographic print from the resulting color separated negative. This result was demonstrated by making two color prints by the following procedures.

In accordance with the conventional procedure, a white light was projected through a transparency and through appropriate color separation filters on to duPont panchromatic separation film for about 25 seconds. The film was then developed to produce primary color separated negatives followed by projecting a white light through the negative on to a matrix for about 25 seconds to produce the separated color matrix positives. The three color separated matrix positives were then used to make the colored image.

A colored image was produced in accordance with the method of this invention. The steps described in the preceding paragraph were repeated but rather than using the color separated negatives for making the matrix film, each of the color separated negatives were further processed. Separated color positives were made by passing white light through the negatives on to duPont panchromatic separation film for about 25 seconds. Then, white light was projected through the separated color positives on to Cronar contact reversal W film CRW-4, a polyester direct reversal film of 0.004" thickness for about 5 seconds and then developed to produce panchromatic primary color separated reversal positives. The separated color positive used to produce the reversal positive and the corresponding reversal positive were then placed into a dual projecting lantern and the images projected through both positives were placed in registry. Thereupon, a negative film, duPont panchromatic separation film, was placed in position and white light shone through both positives. The resulting composite negative was developed, placed in the lantern and white light was projected through the composite negative onto matrix film to produce a color separated photographic matrix. The three resulting photographic prints were then used to obtain a dye-transfer print using the same procedure as used to produce the print of the preceding paragraph.

It will be appreciated by those skilled in the art that various changes and modifications can be made in the method of this invention without departing from the spirit and the scope thereof. The various embodiments set forth herein were for the purpose of further illustrating the invention but were not intended to limit it.

What is claimed is:

1. A method of making a primary color separated negative of improved sharpness, clarity, texture and definition suitable for use in printing which comprises
    a. making a primary color separated negative on panchromatic film of the image to be printed;
    b. making a separated primary color positive on panchromatic film from the separated color negative;
    c. making a reversal primary color positive from the separated color positive on direct reversal film so as to produce a panchromatic primary color separated reversal positive; and
    d. making a primary composite color separated negative from the separated color positive and the primary reversal positive.

2. The method of claim 1 wherein the composite negative is made by the exposure of light through the separated color positive and the reversal positive onto a negative film, the images from the separated color positive and reversal positive having been placed in registry.

3. The method of claim 1 wherein said method is used to make each of the composite primary color separated photographic negatives.

4. The method of claim 3 wherein the resulting photographic negatives are utilized to produce a colored print by dye-transfer printing.

5. The method of claim 3 wherein the resulting photographic negatives are utilized to produce a colored print by photolithography.

6. The method of claim 3 wherein the composite negatives are used to make a positive print.

7. The method of claim 6 wherein positive prints are made on matrix film.

8. A method of making photographic print of improved sharpness, clarity, texture and definition, suitable for use in printing which comprises making a panchromatic primary color separated reversal positive of the image to be printed, and making a composite primary color separated negative from the panchromatic primary color separated reversal positive and another positive of the image to be printed, and making a photographic print from the composite negative.

* * * * *